US009595629B2

(12) United States Patent
Qian et al.

(10) Patent No.: US 9,595,629 B2
(45) Date of Patent: Mar. 14, 2017

(54) ENHANCING PLANARIZATION UNIFORMITY IN OPTICAL DEVICES

(71) Applicants: Wei Qian, Torrance, CA (US); Joan Fong, San Marino, CA (US); Dazeng Feng, El Monte, CA (US); Jay Jie Lai, Artesia, CA (US)

(72) Inventors: Wei Qian, Torrance, CA (US); Joan Fong, San Marino, CA (US); Dazeng Feng, El Monte, CA (US); Jay Jie Lai, Artesia, CA (US)

(73) Assignee: Mellanox Technologies Silicon Photonics Inc., Monterey Park, CA (US)

( * ) Notice: Subject to any disclaimer, the term of this patent is extended or adjusted under 35 U.S.C. 154(b) by 379 days.

(21) Appl. No.: 13/694,048

(22) Filed: Oct. 22, 2012

(65) Prior Publication Data
US 2014/0113397 A1    Apr. 24, 2014

(51) Int. Cl.
H01L 21/00    (2006.01)
H01L 31/18    (2006.01)
G02F 1/025    (2006.01)
G02B 6/122    (2006.01)
G02B 6/12    (2006.01)

(52) U.S. Cl.
CPC .............. H01L 31/18 (2013.01); G02F 1/025 (2013.01); G02B 6/122 (2013.01); G02B 2006/12176 (2013.01)

(58) Field of Classification Search
CPC ......... H01L 27/14643; H01L 27/14689; H01L 31/105; H01L 27/14625; H01L 27/14685; H01L 31/18; G02B 2006/12176; G02B 6/122; G02F 1/025
USPC ........................................................... 439/57
See application file for complete search history.

(56) References Cited
U.S. PATENT DOCUMENTS 8,021,561 B1 *    9/2011    Qian et al. ...................... 216/24
2006/0105479 A1 *    5/2006    Cave et al. .................... 438/22
2006/0272574 A1 *    12/2006    Waite et al. ................... 117/89

* cited by examiner

Primary Examiner — Duy T Nguyen
(74) Attorney, Agent, or Firm — Gavrilovich, Dodd & Lindsey, LLP

(57) ABSTRACT

An optical device is formed from a device precursor having a layer of a light-transmitting medium on a base. A first feature is formed on the device precursor. The device precursor is then processed such that a stop layer protects the first feature and a portion of the device precursor is above the top of the stop layer. The first feature is between the base and the stop layer. The device precursor is planarized such that the portion of the device precursor located above the top of the stop layer becomes flush with the top of the portion of the stop layer that is present on the device precursor after the planarization. During the planarization, the stop layer acts as a planarization stop that slows or stops the rate of planarization.

19 Claims, 5 Drawing Sheets

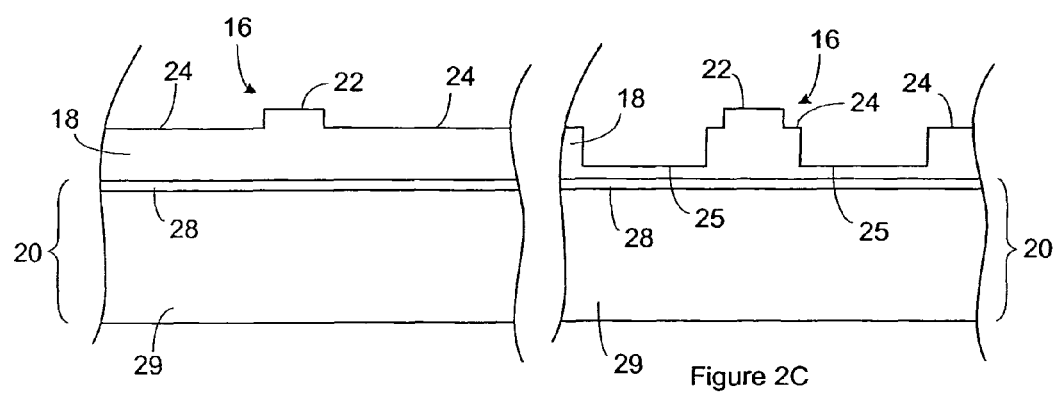
Figure 2B
Figure 2C
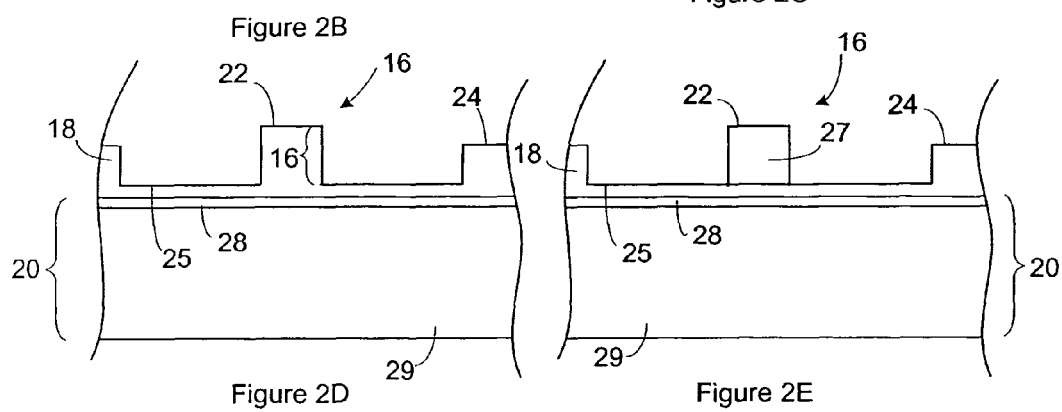
Figure 2D
Figure 2E

ENHANCING PLANARIZATION UNIFORMITY IN OPTICAL DEVICES

FIELD

The present invention relates to optical devices and more particularly to devices having multiple different features.

BACKGROUND

Optical devices often include different optical components for processing of light signals. At one or more times during the fabrication of these components, a planarization may be performed using methods such as chemical-mechanical polishing. Planarization smoothes out the upper surface of the device so that the tops of the different features on the wafer are flush with one another. However, these planarization techniques often consume the underlying materials at rates that are not uniform across the device. As a result, there is a need for an improved process of planarizaing optical devices.

SUMMARY

An optical device is formed from a device precursor having a layer of a light-transmitting medium on a base. A first feature is formed on the device precursor. The device precursor is then processed such that a stop layer protects the first feature and a portion of the device precursor is above the top of the stop layer. The first feature is between the base and the stop layer. The device precursor is planarized such that the top of the portion of the device precursor located above the top of the stop layer becomes flush with the top of the portion of the stop layer that is present on the device precursor after the planarization. During the planarization, the stop layer acts as a planarization stop that slows or stops the rate of planarization.

BRIEF DESCRIPTION OF THE FIGURES

FIG. 2A through FIG. 2F illustrate an example of a device according to FIG. 1 where the device includes one or more waveguides that guide light signals to and/or from an active component. FIG. 2A is a topview of a portion of the optical device.

FIG. 2B is a cross-section of the device shown in FIG. 2A taken along the line labeled C.

FIG. 2C is a cross-section of the optical device shown in FIG. 2A taken along the line labeled D.

FIG. 2D is a cross-section of the optical device shown in FIG. 2A taken along the line labeled E.

FIG. 2E is a cross-section of the optical device shown in FIG. 2A taken along the line labeled F.

FIG. 2F is a cross-section of the optical device shown in FIG. 2A taken along the line labeled G.

FIG. 3A is a cross section of a device precursor after the formation of a first mask on the device precursor followed by etching of the device precursor.

FIG. 3B is a cross section of the device precursor of FIG. 3A after the formation of stop layer on the device precursor.

FIG. 3C is a cross section of the device precursor of FIG. 3B after the formation of a second mask on the device precursor followed by etching of the device precursor.

FIG. 3D is a cross section of the device precursor of FIG. 3C after the growth of an active medium on the device precursor.

FIG. 3E is a cross section of the device precursor of FIG. 3D after planarization.

FIG. 3F is a cross section of the device precursor of FIG. 3E after removal of the stop layer.

FIG. 3G is a cross section of the device precursor of FIG. 3F after formation of a third mask on the device precursor.

FIG. 3H is a cross section of the device precursor of FIG. 3G after etching followed by removal of the third mask and the first mask.

DESCRIPTION

Forming an optical device having different features often includes a planarization step where the top side of the device precursor is substantially flattened. A portion of the features are often made on the device precursor before the planarization step. During planarization, these features are often masked in a way that protects them from the subsequent planarization. The inventors have found that the level of planarization is uneven across a single device precursor. In particular, the planarization processes typically consumes the underlying material at a lower rate in areas of the device precursor having high feature density than occurs at locations with a lower feature density. As a result, after planarization, the portion of the mask over regions of the device precursor with high feature density is often thicker than across other regions of the device precursor. The uneven thickness of this mask can lead to damage of the underlying features during subsequent processing of the device precursor. For instance, areas of the device precursor where the mask is thinnest can be undesirably etched during the removal of the mask.

The inventors make use of a planarization stop in order to reduce the variation in mask thickness resulting from planarization. For instance, before planarization, the inventors protect previously formed features by placing the planarization stop over the features. Second features are formed on the device precursor after the planarization stop is formed on the device precursor. One or more of these second features may extend above the top of the planarization stop. Planarization is then performed in order to planarize the one or more second features down to the level of the planarization stop. The planarization stop is a layer that either stops or slows the planarization process. As a result, the planarization stop does not show the thickness variations that is normally present in mask materials. Additionally, the planarization stop can be removed so as to expose the underlying mask. Since the underlying mask is not exposed to the planarization process, the underlying mask does not shown the thickness variations that are present when the mask is subject to planarization.

Figure 1:
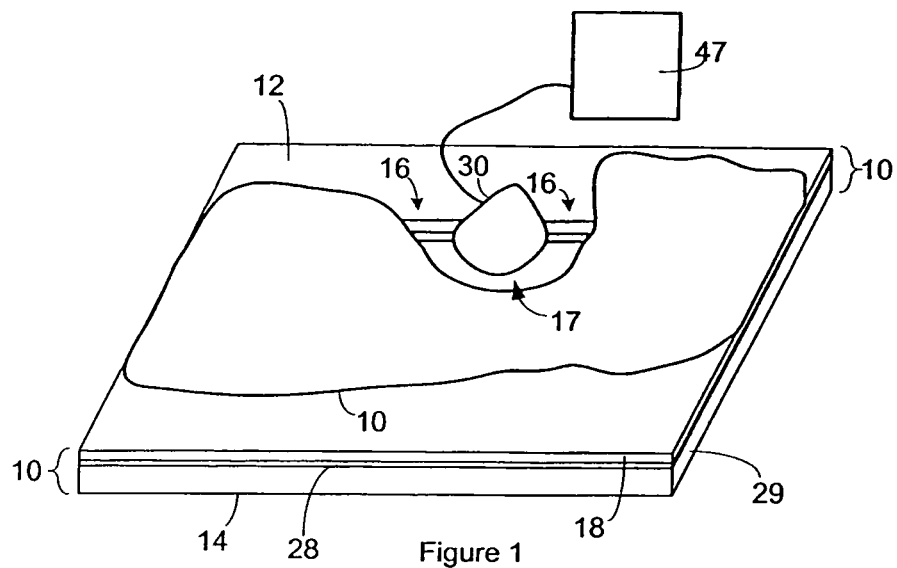
FIG. 1 is a perspective view of an optical device.

FIG. 1 is a perspective view of an optical device within the class of optical devices known as planar optical devices. These devices typically include one or more waveguides immobilized relative to a substrate or a base. The direction of propagation of light signals along the waveguides is generally parallel to a plane of the device. Examples of the plane of the device include the topside of the base, the bottom side of the base, the topside of the substrate, and/or the bottom side of the substrate.

The illustrated device includes lateral sides 10 (or edges) extending from a topside 12 to a bottom side 14. The propagation direction of light signals along the length of the waveguides on a planar optical device generally extends through the lateral sides 10 of the device. The topside 12 and the bottom side 14 of the device are non-lateral sides.

The device includes one or more waveguides 16 that carry light signals to and/or from optical components 17. Examples of inactive optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, vias that provide an optical pathway for a light signal traveling through the device from the bottom side 14 of the device to the top side 12 of the device, and alignment marks for aligning features on the device and/or the device with other devices and/or other components. The one or more components 17 can be active components such as optical switches, lasers that act a source of a light signal, amplifiers for amplifying the intensity of a light signal, attenuators for attenuating the intensity of a light signal, modulators for modulating a signal onto a light signal, and light sensors that convert an light signal to an electrical signal. Additionally, the device can optionally, include electrical components. For instance, the device can include electrical connections for applying a potential or current to a waveguide and/or for controlling other components on the optical device.

Figure 2A:
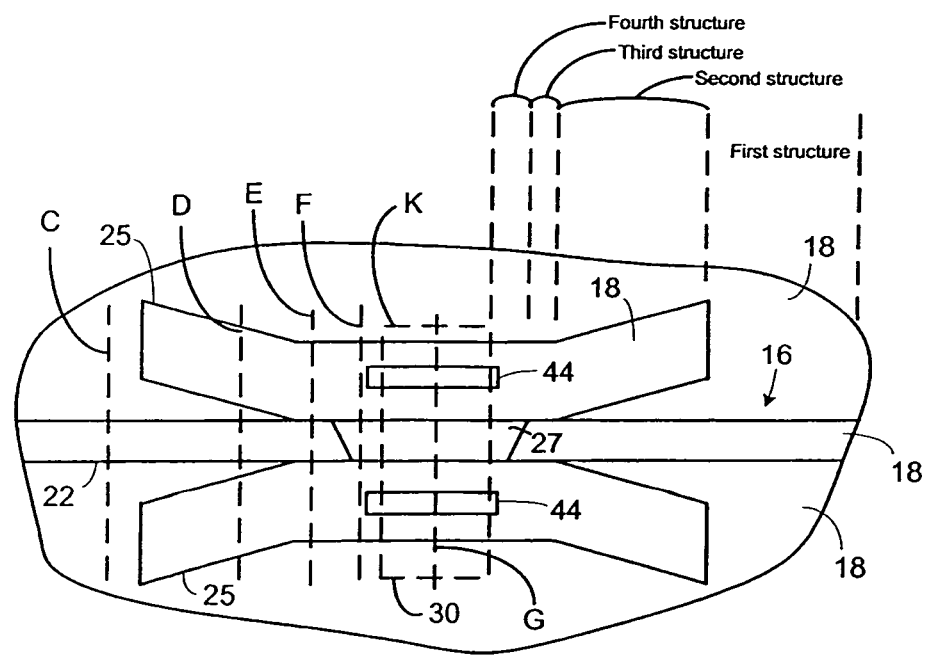
Figure 2F:
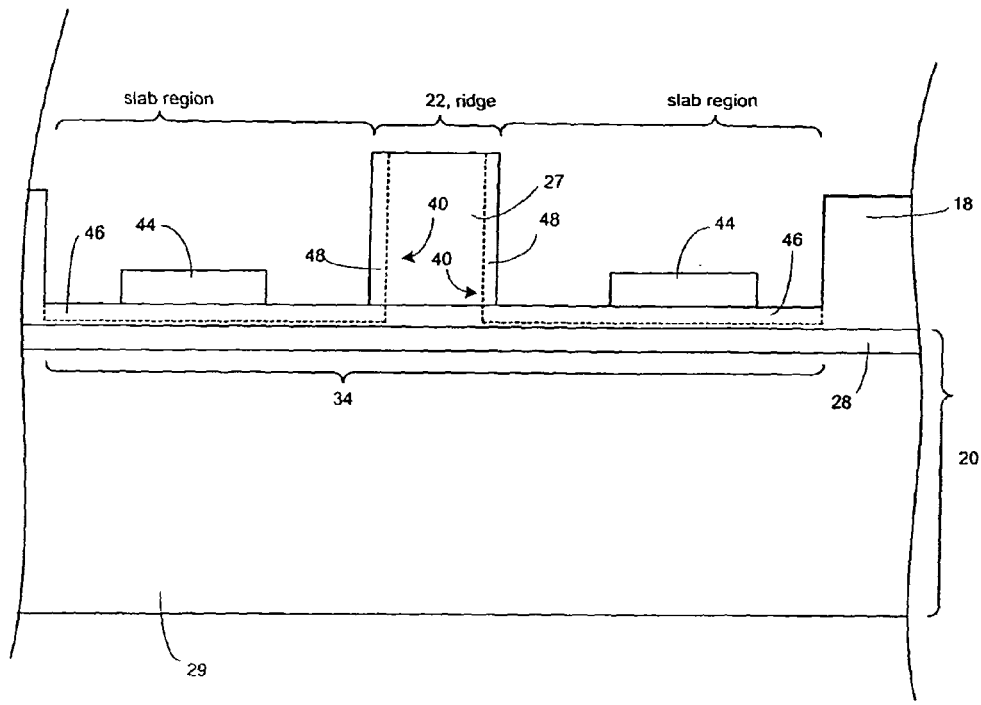

FIG. 2A through FIG. 2F illustrate an example of a device according to FIG. 1A where the device includes waveguides 16 that guide light signals to and/or from an active component. FIG. 2A is a topview of the portion of the optical device. FIG. 2B is a cross-section of the device shown in FIG. 2A taken along the line labeled C. FIG. 2C is a cross-section of the optical device shown in FIG. 2A taken along the line labeled D. FIG. 2D is a cross-section of the optical device shown in FIG. 2A taken along the line labeled E. FIG. 2E is a cross-section of the optical device shown in FIG. 2A taken along the line labeled F. FIG. 2F is a cross-section of the optical device shown in FIG. 2A taken along the line labeled G.

A portion of the waveguide includes a first structure where a portion of the waveguide 16 is defined in a light-transmitting medium 18 positioned on a base 20. For instance, a portion of the waveguide 16 is partially defined by a ridge 22 extending upward from a slab portion of the light-transmitting medium 18 as shown in FIG. 2B. In some instances, the top of the slab portion is defined by the bottom of trenches 24 extending partially into the light-transmitting medium 18 or through the light-transmitting medium 18. Suitable light-transmitting media include, but are not limited to, silicon, polymers, silica, SiN, GaAs, InP and $LiNbO_3$. One or more cladding layers (not shown) are optionally positioned on the light-transmitting medium. The one or more cladding layers can serve as a cladding for the waveguide 16 and/or for the device. When the light-transmitting medium 18 is silicon, suitable cladding layers include, but are not limited to, silicon, polymers, silica, SiN, GaAs, InP and $LiNbO_3$.

Recesses 25 (FIG. 2A) extend into the slab portions such that the ridge 22 is positioned between recesses 25. The recesses 25 can extend only part way into the light-transmitting medium 18 or through the light-transmitting medium 18. As is evident from FIG. 2C, the recesses 25 can be spaced apart from the ridge 22. As a result, a portion of the waveguide 16 includes a second structure where an upper portion of the waveguide 16 is partially defined by the ridge 22 extending upward from the slab portions and a lower portion of the waveguide is partially defined by recesses 25 extending into the slab portions and spaced apart from the ridge.

As shown in FIG. 2D, the recesses 25 can approach the ridge 22 such that the sides of the ridge 22 and the sides of the recesses 25 combine into a single surface 26. As a result, a portion of a waveguide includes a third structure where the waveguide is partially defined by the surface 26.

As is evident in FIG. 2A, an active medium 27 defines a portion of the waveguide that serves as a component waveguide. The component waveguide is butt-coupled with the ridge of the light-transmitting medium such that the component waveguide receives the light signals from the portion of the waveguide having the third structure and guides the received light signals to another portion of the waveguide having the third structure.

In FIG. 2E, a ridge 22 of active medium 27 extends upward from slab regions of the light-transmitting medium 18. In particular, the ridge 22 of active medium 27 contacts and extends upward from the portion of the light-transmitting medium 18 that defines the bottom of the recess 25. Accordingly, a portion of a waveguide includes a fourth structure where the waveguide is partially defined by the top and lateral sides of the active medium 27. When the light signal travels from the ridge of the light-transmitting medium into the ridge of the active medium, a portion of the waveguide enters the portion of the light-transmitting medium 18 located between the active medium and the base.

As is evident in FIG. 2A, there is an interface between each facet of the active medium 27 and a facet of the light-transmitting medium 18. The interface can have an angle that is non-perpendicular relative to the direction of propagation of light signals through the waveguide 16 at the interface. In some instances, the interface is substantially perpendicular relative to the base 20 while being non-perpendicular relative to the direction of propagation. The non-perpendicularity of the interface reduces the effects of back reflection. Suitable angles for the interface relative to the direction of propagation include but are not limited to, angles between 80° and 89°, and angles between 80° and 85°.

The portion of the base 20 adjacent to the light-transmitting medium 18 is configured to reflect light signals from the waveguide 16 back into the waveguide 16 in order to constrain light signals in the waveguide 16. For instance, the portion of the base 20 adjacent to the light-transmitting medium 18 can be an optical insulator 28 with a lower index of refraction than the light-transmitting medium 18. The drop in the index of refraction can cause reflection of a light signal from the light-transmitting medium 18 back into the light-transmitting medium 18. The base 20 can include the optical insulator 28 positioned on a substrate 29. As will become evident below, the substrate 29 can be configured to transmit light signals. For instance, the substrate 29 can be constructed of a light-transmitting medium 18 that is different from the light-transmitting medium 18 or the same as the light-transmitting medium 18. In one example, the device is constructed on a silicon-on-insulator wafer. A silicon-on-insulator wafer includes a silicon layer that serves as the light-transmitting medium 18. The silicon-on-insulator wafer also includes a layer of silica positioned on a silicon substrate. The layer of silica can serving as the optical insulator 28 and the silicon substrate can serve as the substrate 29.

The optical device includes an active component 30 such as a modulator and/or light sensor. The location of the active component on the optical device is illustrated by the line labeled K in FIG. 2A. In order to simplify FIG. 2A, the details of the active component construction are not shown in FIG. 2A. However, the active component construction is evident from other illustrations such as FIG. 2F. The active component construction of FIG. 2F is constructed on the portion of the waveguide having a fourth structure constructed according to FIG. 2E. The perimeter of portions of doped regions shown in FIG. 2F are illustrated with dashed lines to prevent them from being confused with interfaces between different materials. The interfaces between different materials are illustrated with solid lines. When the active component is configured to operate as a modulator, the active component construction is configured to apply an electric field to the active medium 27 in order to phase and/or intensity modulate the light signals received by the modulator.

A ridge 22 of the active medium 27 extends upward from slab regions of the light-transmitting medium 18. Doped regions 40 are both in the slab regions of the light-transmitting medium 18 and also in the ridge of the active medium 27. For instance, doped regions 40 of the active medium 27 are positioned on the lateral sides of the ridge 22 of the active medium 27. In some instances, each of the doped regions 40 extends up to the top side of the active medium 27 as shown in FIG. 2F. Additionally, the doped regions 40 extend away from the ridge 22 into the slab regions of the light-transmitting medium 18. The transition of a doped region 40 from the ridge 22 of the active medium 27 into the slab regions of the light-transmitting medium 18 can be continuous and unbroken as shown in FIG. 2F.

Each of the doped regions 40 can be an N-type doped region or a P-type doped region. For instance, each of the N-type doped regions can include an N-type dopant and each of the P-type doped regions can include a P-type dopant. In some instances, the active medium 27 includes a doped region 40 that is an N-type doped region and a doped region 40 that is a P-type doped region. The separation between the doped regions 40 in the active medium 27 results in the formation of PIN (p-type region-insulator-n-type region) junction in the modulator 30.

In the active medium 27, suitable dopants for N-type regions include, but are not limited to, phosphorus and/or arsenic. Suitable dopants for P-type regions include, but are not limited to, boron. The doped regions 40 are doped so as to be electrically conducting. A suitable concentration for the P-type dopant in a P-type doped region includes, but is not limited to, concentrations greater than $1\times10^{15}$ $cm^{-3}$, $1\times10^{17}$ $cm^{-3}$, or $1\times10^{19}$ $cm^{-3}$, and/or less than $1\times10^{17}$ $cm^{-3}$, $1\times10^{19}$ $cm^{-3}$, or $1\times10^{21}$ $cm^{-3}$. A suitable concentration for the N-type dopant in an N-type doped region includes, but is not limited to, concentrations greater than $1\times10^{15}$ $cm^{-3}$, $1\times10^{17}$ $cm^{-3}$, or $1\times10^{19}$ $cm^{-3}$, and/or less than $1\times10^{17}$ $cm^{-3}$, $1\times10^{19}$ $cm^{-3}$, or $1\times10^{21}$ $cm^{-3}$.

Electrical conductors 44 are positioned on the slab regions of the light-transmitting medium 18. In particular, the electrical conductors 44 each contact a portion of a doped region 40 that is in the slab regions of the light-transmitting medium 18. Accordingly, each of the doped regions 40 is degeneratively doped at a concentration that allows it to provide electrical communication between an electrical conductor 44 and one of the doped regions 40 in the active medium 27. As a result, electrical energy can be applied to the electrical conductors 44 in order to apply an electric field to the active medium 27. The region of the light-transmitting medium 18 or active medium between the doped regions 40 can be undoped or lightly doped as long as the doping is insufficient for the doped material to act as an electrical conductor that electrically shorts the active component.

Figure 2G:
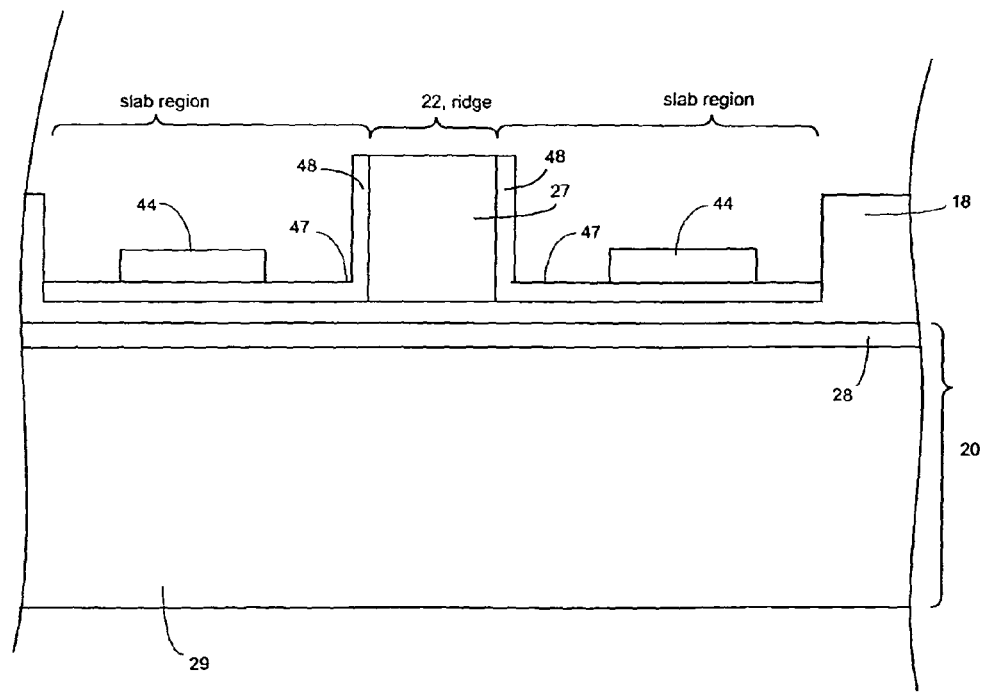
FIG. 2G is a cross-section of the optical device shown in FIG. 2A taken along the line labeled G.

FIG. 2G is a cross-section of another embodiment of an active component. The cross-section shown in FIG. 2G can represent a cross section of the device shown in FIG. 2A taken along the line labeled G in FIG. 2A. The active component construction of FIG. 2G is constructed on the portion of the waveguide having a fourth structure constructed according to FIG. 2E. The modulator includes electrical current carriers 47 as functional replacements for the doped regions in the active component of FIG. 2F. Current carriers 47 are each positioned on the slab regions and also extend at least part way up a side of the ridge of the active medium. The transition of a current carrier 47 from the ridge 22 of the active medium 27 onto a slab region of the light-transmitting medium 18 can be continuous and unbroken as shown in FIG. 2G.

As is evident from FIG. 2G, the current carriers 47 can extend from one of the slab regions and into contact with the ridge before extending up a lateral side of the ridge. The height of the portion of the current carriers 47 extending up the lateral side of the ridge can be greater than the thickness of the portion of the current carrier located on the base. As a result, a portion of each current carrier can be located above the portion of the current carrier located on the base. In this arrangement, the top of the portion of the current carrier over the base moves toward the ridge turns or bends upward as a result of the current carrier extending up the lateral side of the ridge. The current carriers 47 preferable extend up more than 50%, 75%, or 90% of the height of the ridge 22.

The portion of the current carriers 47 located on the base can extend further away from the ridge than the thickness of the portion of the current carrier extending up the side of the ridge. In this arrangement, the top of the portion of the current carrier on the ridge moves toward the base and then turns or bends away from the ridge as a result of the current carrier extending away from the ridge. The current carriers can extend more than 5 μm, 10 μm, or 15 μm away from the ridge 22.

A suitable current carrier 47 includes electrically conducting materials such as metals that form a Schottky barrier at the interface of the current carrier 47 and the active medium 27. However, many of these materials absorb light at undesirably high levels. Another alternative for the current carrier 47 is electrically conducting materials that are transmit light at the operational wavelengths but form neither a Schottky barrier at the interface of the current carrier 47 and the active medium 27 nor a depletion region within the active medium during the application of a reverse bias. In these instances, the index of refraction for the current carrier 47 is preferably less than the index of refraction of the active medium in order to reduce or prevent entry of light into the current carrier 47 from the active medium. Examples of these materials may include conducting polymers such as poly(3, 4-ethylenedioxythiophene):poly(styrene sulfonate) (PEDOT:PSS). Operation of the active component without a Schottky barrier(s) or depletion region is likely to be undesirably slow.

In another option, a carrier material that transmits light and is doped serves as one or more of the current carriers 47. In these instances, the index of refraction for the current carrier 47 can be less than the index of refraction of the active medium in order to reduce or prevent entry of light into the current carrier 47 from the active medium. In some instances, the index of refraction of the current carrier 47 is also less than the index of refraction of the light-transmitting medium in order to reduce or prevent entry of light into the current carrier 47 from the active medium. When the active medium 27 is germanium or $Ge_{1-x}Si_x$ (germanium-silicon) where x is greater than or equal to zero, an example of a suitable carrier material includes, but is not limited to, polysilicon, amorphous silicon, and indium tin oxide.

Doping of the material of the current carrier 47 can make the carrier material electrically conducting and/or increase the electrical current carrying capability of the carrier material. As shown in FIG. 2G, the entire carrier material can be doped and can accordingly serve as the current carrier. Alternately, a portion of the carrier material can be doped. Since the doping can increase the electrical conductivity of the carrier medium, each doping region can extend from contacting one of the electrical conductors 44 into contact with the ridge of the active medium 27.

As will be described below, the carrier material can be doped such that a depletion region forms in the active medium 27 upon application of a reverse bias to the active component. The depletion region can increase the response time of the active component. Accordingly, moving the doped regions 48 of one or more current carriers 47 closer to the ridge of the active medium 27 can increase the size of the depletion region. In some instances, the carrier material is doped such that one or more of the doped regions 48 each contacts the ridge of the active medium 27.

Each of the doped regions 48 can be an N-type doped region or a P-type doped region. For instance, each of the N-type doped regions can include an N-type dopant and each of the P-type doped regions can include a P-type dopant. In some instances, a current carrier 47 includes a doped region 48 that is an N-type doped region and on the opposing side of the ridge is another current carrier 47 that includes a doped region 48 that is a P-type doped region. In this instance, the active medium separates the doped regions 48 so as to form a P-I-N (p-type region-intrinsic region-n-type region) junction in the active component. Accordingly, under reverse bias, the intrinsic region (the active medium 27) can be depleted of carriers (form a depletion region) and accordingly build up a field that quickly sweeps the carriers out of the intrinsic region. This configuration increases the response speed of the active component.

Suitable dopants for N-type regions include, but are not limited to, phosphorus and/or arsenic. Suitable dopants for P-type regions include, but are not limited to, boron. A suitable concentration for the P-type dopant in a P-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$. A suitable concentration for the N-type dopant in an N-type doped region includes, but is not limited to, concentrations greater than $1\times10^{15}$ cm$^{-3}$, $1\times10^{17}$ cm$^{-3}$, or $1\times10^{19}$ cm$^{-3}$, and/or less than $1\times10^{17}$ cm$^{-3}$, $1\times10^{19}$ cm$^{-3}$, or $1\times10^{21}$ cm$^{-3}$.

Electrical conductors 44 are positioned on the current carriers 47. When the current carriers 47 include doped regions 48 for carrying electrical energy, the doped regions 48 preferably extend from the electrical conductor to the active medium in the ridge. For instance, FIG. 2G shows the electrical conductors 44 each contacting a portion of a doped region 48 that is included in a current carrier 47 and the contacted doped region 48 extends into contact with the active medium 27 in the ridge 22. Accordingly, each of the current carriers 47 can provide electrical communication between an electrical conductor 44 and the active medium 27 in the ridge. As a result, electrical energy can be applied to the electrical conductors 44 in order to apply the electric field to the active medium 27.

The region of the light-transmitting medium or active medium between the current carriers 47 can be undoped or lightly doped as long as the doping is insufficient for the doped material to act as an electrical conductor that electrically shorts the active component.

An active component constructed according to FIG. 2F or FIG. 2G can be operated as a modulator. During operation of the active component as a modulator, electronics 47 (FIG. 1A) can be employed to apply electrical energy to the electrical conductors 44 so as to form an electrical field in the active medium 27. For instance, the electronics can form a voltage differential between the field sources. The electrical field can be formed without generating a significant electrical current through the active medium 27. The active medium 27 can be a medium in which the Franz-Keldysh effect occurs in response to the application of the electrical field. The Franz-Keldysh effect is a change in optical absorption and optical phase by an active medium 27. For instance, the Franz-Keldysh effect allows an electron in a valence band to be excited into a conduction band by absorbing a photon even though the energy of the photon is below the band gap. To utilize the Franz-Keldysh effect the active region can have slightly larger bandgap energy than the photon energy of the light to be modulated. The application of the field lowers the absorption edge via the Franz-Keldysh effect and makes absorption possible. The hole and electron carrier wavefunctions overlap once the field is applied and thus generation of an electron-hole pair is made possible. As a result, the active medium 27 can absorb light signals received by the active medium 27 and increasing the electrical field increases the amount of light absorbed by the active medium 27. Accordingly, the electronics can tune the electrical field so as to tune the amount of light absorbed by the active medium 27. As a result, the electronics can intensity modulate the electrical field in order to modulate the light signal. Additionally, the electrical field needed to take advantage of the Franz-Keldysh effect generally does not involve generation of free carriers by the electric field.

Suitable active media 27 for use in the modulator include electro-absorption media 27 such as semiconductors. However, the light absorption characteristics of different semiconductors are different. A suitable semiconductor for use with modulators employed in communications applications includes $Ge_{1-x}Si_x$ (germanium-silicon) where x is greater than or equal to zero. In some instances, x is less than 0.05, or 0.01. Changing the variable x can shift the range of wavelengths at which modulation is most efficient. For instance, when x is zero, the modulator is suitable for a range of 1610-1640 nm. Increasing the value of x can shift the range of wavelengths to lower values. For instance, an x of about 0.005 to 0.01 is suitable for modulating in the c-band (1530-1565 nm).

An active component constructed according to FIG. 2F or FIG. 2G can be operated as a light sensor in addition or as an alternative to operating it as a modulator. For instance, the active medium 27 can be a light-absorbing medium such as germanium. During operation of the active component, a reverse bias electrical field is applied across the active medium 27. When the active medium 27 absorbs a light signal, an electrical current flows through the active medium 27. As a result, an electrical current through the light-absorbing medium indicates receipt of a light signal. Additionally, the magnitude of the current can indicate the power and/or intensity of the light signal. Different active media 27 can absorb different wavelengths and are accordingly suitable for use in a light sensor depending on the function of the light sensor. A light-absorbing medium that is suitable for detection of light signals used in communications applications includes, but are not limited to, germanium, silicon germanium, silicon germanium quantum well, GaAs, and InP. Germanium is suitable for detection of light signals having wavelengths in a range of 1300 nm to 1600 nm.

A suitable thickness (distance between top of ridge 22 and the base 20) for the portion of the waveguide 16 having the first structure (FIG. 2B) includes, but is not limited to, heights greater than 1 µm, 2 µm, and 3 µm. A suitable width of the ridge for the portion of the waveguide 16 having the first structure (FIG. 2B) includes, but is not limited to, widths greater than 1 µm, 2 µm, and 3 µm. A suitable height (distance between top of ridge 22 and the slab portions) for the portion of the waveguide 16 having the first structure (FIG. 2B) includes, but is not limited to, heights greater than 1 µm, 2 µm, or 3 µm and/or less than 4 µm, 5 µm, or 6 µm. A suitable thickness for the slab regions extending outward from the active medium includes, but is not limited to, a thickness greater than 0.1 µm, 0.2 µm, or 0.3 µm and/or less than 0.4 µm, 0.5 µm, or 0.6 µm. A suitable width for the top of the ridge of the active medium includes, but is not limited to, a width greater than 0.4 µm, 0.6 µm, or 0.7 µm and/or less than 0.9 µm, 1.2 µm, or 1.5 µm.

Modulators and/or light sensors having a cross section according to 1G or FIG. 2G can be used in configurations other than the configuration of FIG. 1A through 1F. Additional details about the fabrication, structure and operation of a modulator having a cross section according to FIG. 2F or FIG. 2G can be found in U.S. patent application Ser. No. 12/653,547, filed on Dec. 15, 2009, entitled "Optical Device Having Modulator Employing Horizontal Electrical Field," and incorporated herein in its entirety. Additional details about the fabrication, structure and operation of a light sensor having a cross section according to FIG. 2F or FIG. 2G can be found in U.S. Patent Application No. 61/572,841, filed on Jul. 21, 2011, entitled "Optical Device Having Light Sensor with Doped Regions;" and also in U.S. patent application Ser. No. 13/136,828, filed on Aug. 10, 2011, entitled "Application of Electrical Field Power to Light-Transmitting Medium," each of which is incorporated herein in its entirety.

FIG. 3A through FIG. 3G illustrate a method of optical device fabrication that can be employed to generate various features of an optical device. For instance, the method of FIG. 3A to FIG. 3G can be employed to form the different features on a device according to FIG. 1A through FIG. 2G. The method is illustrated on a wafer or chip that serves as a device precursor. Each of the figures in FIG. 3A through FIG. 3G includes two images. The images in a single figure represent cross sections of the device precursor taken at two different locations on the device precursor at the same moment in time. The method makes use of technologies that are employed in the fabrication of integrated circuits, opto-electronic circuits, and/or optical devices. Although the method is illustrated using a silicon-on-insulator wafer, the method can be used on other platforms.

Figure 3A:
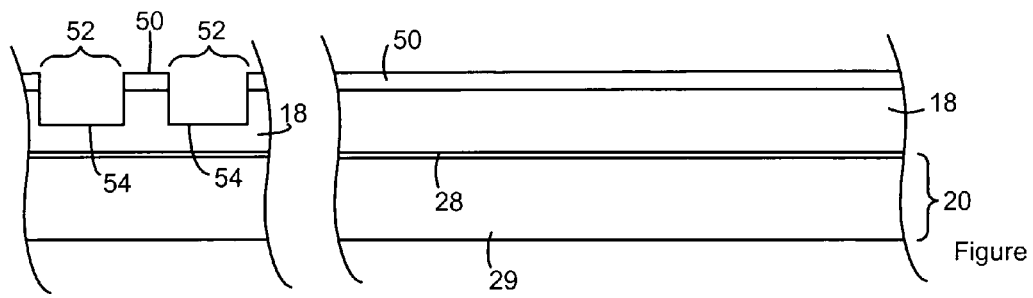
FIG. 3A through FIG. 3H illustrate an example of a method of forming an optical device having different features as shown in FIG. 1A through FIG. 2G.

The illustrated device precursor has a layer of the light-transmitting medium 18 positioned on a base 20 as shown in FIG. 3A. FIG. 3A is a cross-section of the device precursor. A first mask 50 is formed on the device precursor so as to define exposed regions 52 in the first mask 50. The exposed regions 52 are regions of the device precursor where one or more features of the device are to be fully or partially etched. When the light-transmitting medium 18 is silicon, a suitable first mask 50 includes, but is not limited to, a hard mask such as thermally grown silicon dioxide or a TEOS (tetraethyl orthosilicate) plasma-enhanced chemical vapor deposited (PECVD) silicon dioxide.

A first etch is then performed so as to provide the device precursor of FIG. 3A. For instance, the features illustrated in FIG. 3A are one or more recesses 54 etched into the light-transmitting medium 18. The bottom of the recesses 54 shown in FIG. 3A can represent the bottom of the trenches 24 shown in FIG. 2B. A suitable first etch includes, but is not limited to, dry etch and wet etch. An example dry etch employs compounds that include or consist of chlorine and/or fluorine such as $CF_4$, $SF_6$, and $Cl_2$ and combinations thereof.

Although the features shown etched into the device precursor of FIG. 3A are disclosed as representing parts of a waveguide on a device according to FIG. 2A through FIG. 2G, the features can represent other components on the device or features needed during the fabrication of other components. As a result, in some instances, the features include a single recess 54 etched into the device precursor or more than two recesses 54 etched into the device precursor. For instance, the features shown in FIG. 3A can represent alignment marks, the grooves in an optical grating, or the slab region(s) of an optical waveguide.

Figure 3B:
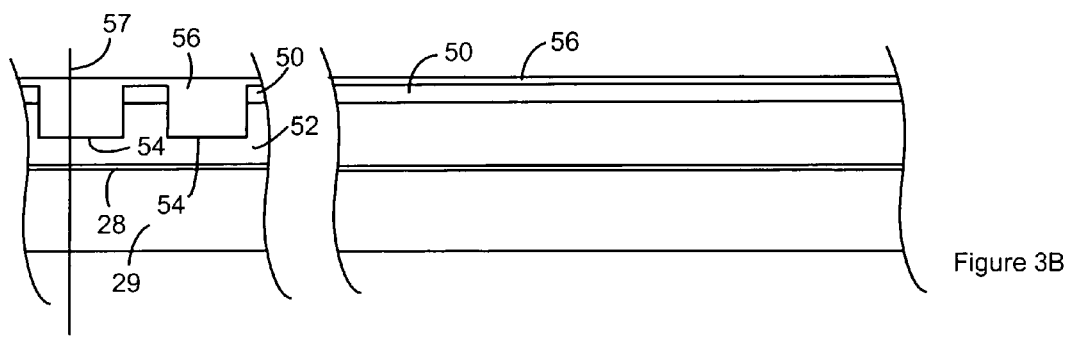

A stop layer 56 is then formed on the device precursor so as to provide the device precursor of FIG. 3B. The stop layer 56 protects the features and also protects the remainder of the device precursor. An imaginary line 57 that is perpendicular to the base extends through a side of the recess 50 and contacts the stop layer. A suitable stop layer 56 includes, but is not limited to, plasma-enhanced chemical vapor deposited (PECVD) silicon nitride, or sputtered silicon nitride.

A second mask 58 is formed on the device precursor of FIG. 3B. The second mask 58 includes one or more second exposed regions 60 where one or more second features of the device are to be fully or partially formed. A second etch is selected and performed so it etches through the stop layer 56 and through the underlying first mask 50, and into or through the light-transmitting medium 18. For instance, the second etch can be selected and performed so as to provide the device precursor of FIG. 3C. A suitable second mask 58 includes, but is not limited to, a layer of TEOS (tetraethyl orthosilicate) PECVD deposited silicon dioxide. A suitable second etch includes, but is not limited to, a dry etch.

Figure 3C:
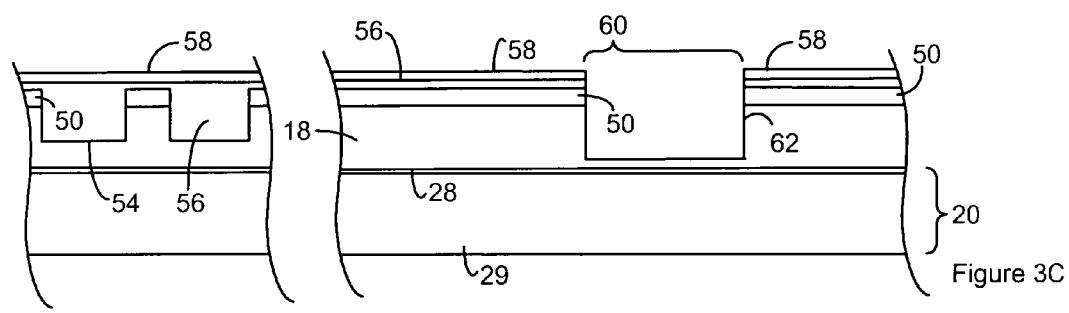

The second etch forms the second recess 62 shown in FIG. 3C. The bottom of the second recess 62 can represent the bottom of the recess 25 shown in FIG. 2C. Although the second recess 62 shown etched into the device precursor of FIG. 3B are disclosed as representing parts of an active component on a device according to FIG. 2A through FIG. 2G, the second recess 62 can be part of a different components on the device or part of a different features needed during the fabrication of other components. As a result, in some instances, the second features include a single recess etched into the device precursor or more than two recesses etched into the device precursor. For instance, the second features can be areas for epitaxial growth, waveguide slab regions, or deep-etched waveguide slab regions.

Figure 3D:
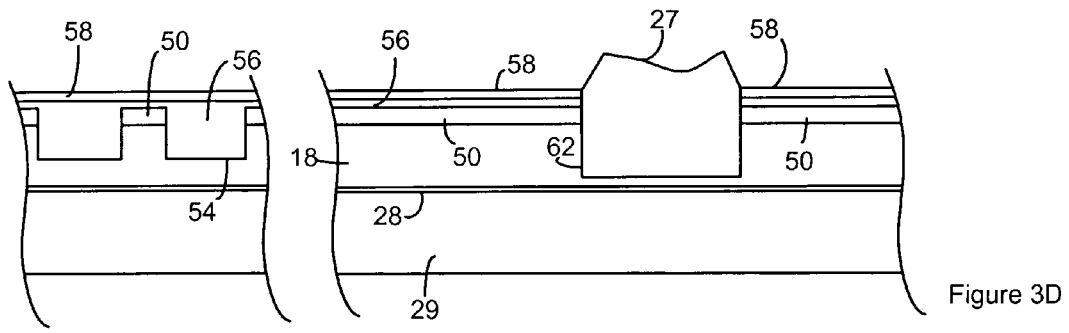
Figure 3E:
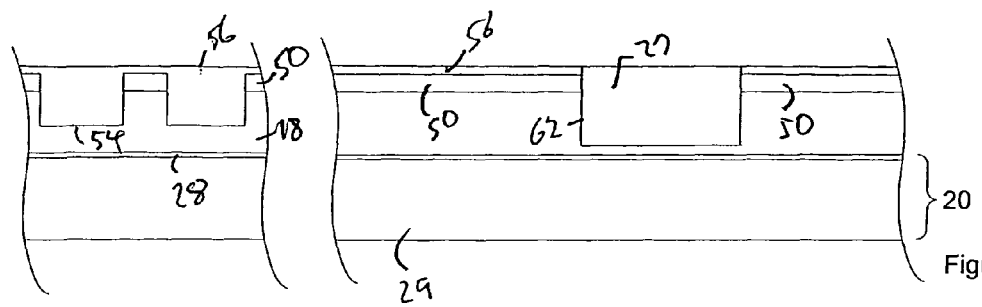

An active medium 27 is grown in the bottom of the second recess 62 so as to provide the device precursor of FIG. 3D. Suitable techniques for growing the active medium 27 include, but are not limited to, techniques such as chemical vapor deposition (CVD) and low pressure chemical vapor deposition (LPCVD).

Because growth of the active medium 27 cannot be accurately controlled, the active medium 27 is grown until it extends through the stop layer 56 and a portion of the active medium 27 is positioned above the top of the stop layer 56. As a result, it may be desirable to planarize the device precursor such that active medium 27 is flush with the remainder of the upper surface of the device precursor. For instance, the device precursor of FIG. 3D is planarized so as to provide the device precursor of FIG. 3E. Planarization flattens the uppermost surface of the device precursor. For instance, planarization is generally performed such that the upper surface of the different materials that make up the top of the device precursor are flush with one another. As an example, planarization can be performed such that the top of the active medium 27 is both flat and flush with the top of the stop layer 56. The second mask 58 can optionally be removed before the planarization or can be in place during the planarization. When the second mask 58 is in place during planarization, the planarization process can remove the second mask 58. Suitable planarization methods include, but are not limited to, chemical-mechanical polishing (CMP).

Although FIG. 3A through FIG. 3G show a single active medium 27 grown in a single second recess 62, multiple second recesses 62 can be formed on the device precursor and active medium 27 can be grown in more than one of the second recesses 62. As a result, the fabrication of an optical device can include the creation of more than one second feature that is planarized.

During planarization, the stop layer 56 acts as a planarization stop. For instance, the planarization process consumes the planarized material at a faster rate than the planarization process consumes the stop layer 56. The planarized material includes or consists of the one or more materials that are located above the stop layer 56 and are exposed to the planarization process such that the material is removed or consumed by the planarization process. For instance, in FIG. 3D, the active medium 27 is located above the level of the stop layer 56 and is exposed to the planarization process. As a result, the upper region of the active medium 27 serves as a planarized material. If the second mask 58 is not removed before the planarization is performed, the second mask 58 also serves as a planarized material. The rate at which the stop layer 56 is consumed by the planarization process is lower than the rate at which the planarized material is consumed by the planarization process. For instance, a ratio of the rate at which the planarization process consumes the planarized material: the rate at which the planarization process consumes the stop layer 56 may be more than 500:1, 100:1, or 10:1. In the above description, the second mask 58 and the active medium 27 can serve as the planarized material and SiN can serve as the stop layer 56. As a result, the ratio of the rate at which the planarization process consumes the silicon dioxide: the rate at which the planarization process consumes the SiN layer may be more than 500; 1, 100; 1, or 10; 1. In some instances, the planarization process does not have any measurable consumption of the stop layer 56.

Many planarization processes such as chemical-mechanical polishing (CMP) achieve planarization by a combination of both mechanical and chemical mechanisms. For instance, the planarization process can include direct physical contact between a polishing instrument in the presence of a chemical etchant. The preferential consumption of the planarization process for the planarized material over the stop layer 56 may be a result of the stop layer 56 being more resistant to the polishing and/or to the chemical etchant than the planarized material.

Figure 3F:
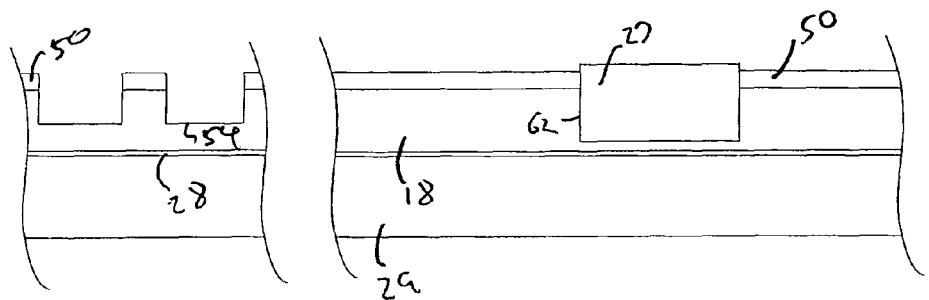

The stop layer 56 can be removed so as to provide the device precursor of FIG. 3F. When the stop layer 56 includes materials such as SiN, a suitable method for removing the stop layer 56 includes, but is not limited to, wet etching.

The device precursor of FIG. 3F can be further processed. For instance, a third mask 66 can be formed on the device precursor of FIG. 3F so as to provide the device precursor of Figure of FIG. 3G. The third mask 66 protects the portion of the active medium 27 where the ridge 22 is to be formed in the active medium 27 while leaving the remainder of the active medium 27 exposed.

Figure 3G:
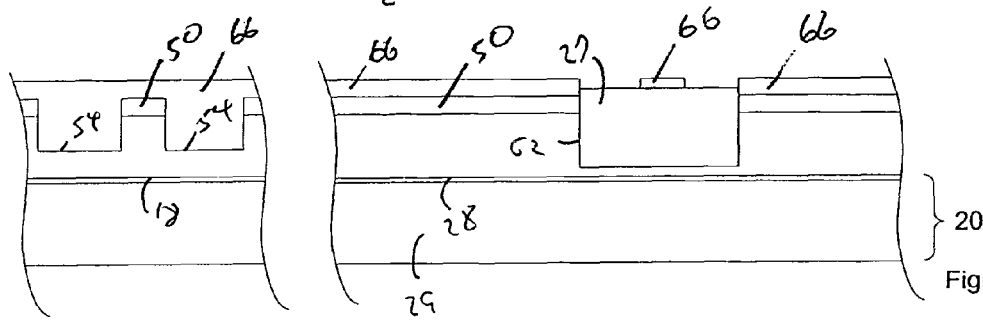
Figure 3H:
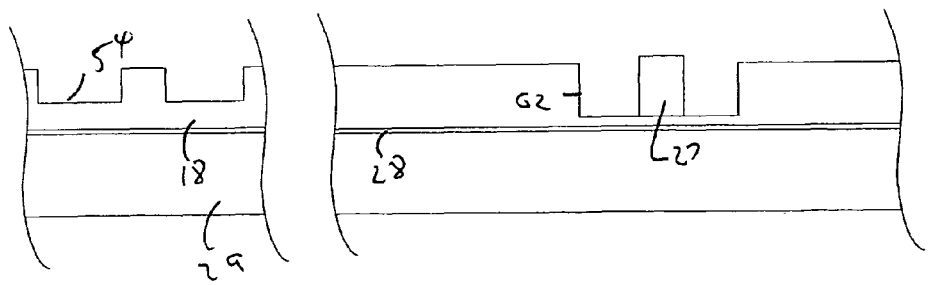

A third etch is performed on the device precursor of FIG. 3G. The third etch is performed so as to provide the ridge 22 of active medium 27 with the desired height. The third mask 66 and the first mask 50 are then removed so as to provide the device precursor of FIG. 3H.

Many variations of the above method can be employed. For instance, the first mask can optionally be removed before the application of the etch stop. Further, the first features and second features are shown extending into the light-transmitting medium but can extend through the light-transmitting medium to the base or into the base. Further, all or a portion of the first features and/or the second features need not extend into the device precursor or need not be etched into the device precursor. For instance, all or a portion of the first features and/or second features can be grown on the device precursor before being protected by the stop layer.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A method of forming an optical device, comprising:
   generating a device precursor having a layer of a light-transmitting medium on a base, the device precursor being a precursor for the optical device;
   forming a first feature on the device precursor, the feature including a recess in the device precursor;
   processing the device precursor such that a stop layer protects the first feature and a portion of the device precursor is above a top of the stop layer,
   the stop layer protecting the first feature such that the recess is between the base and the stop layer; and
   planarizing the device precursor such that the portion of the device precursor located above a top of the stop layer becomes flush with the top of the stop layer,
   the stop layer acting as a planarization stop while planarizing the device precursor, wherein the stop layer extends across an opening of the recess.

2. The method of claim 1, wherein the portion of the device precursor located above a top of the stop layer includes an active medium and a ratio of a rate at which the planarization consumes the active medium: a rate at which the planarization consumes the stop layer is greater than 100:1.

3. The method of claim 1, wherein the portion of the device precursor located above a top of the stop layer includes an active medium and a ratio of a rate at which the planarization consumes the active medium: a rate at which the planarization consumes the stop layer is greater than 100:1.

4. The method of claim 1, wherein the recess extends into the light-transmitting medium.

5. The method of claim 1, wherein forming a ridge of an optical waveguide on the device precursor includes forming the recess.

6. The method of claim 1, wherein the first feature is one of a plurality of first features that are protected by the stop layer.

7. The method of claim 1, wherein processing the device precursor includes forming the stop layer on the device precursor; and
   forming a second feature on the device precursor after forming the stop layer.

8. The method of claim 7, wherein the second feature is one of a plurality of second features formed on the device precursor after forming the stop layer and before performing the planarization.

9. The method of claim 7, wherein forming the second feature on the device includes forming a second recess on the device precursor such that the second recess extends into the light-transmitting medium and the portion of the device precursor located above the top of the stop layer includes a medium that extends through the stop layer and into an interior of the second recess.

10. The method of claim 9, further comprising:
    generating an active component on the device precursor, the medium serving as an active medium in the active component.

11. The method of claim 10, wherein generating the active component includes generating an optical waveguide configured to guide a light signal through the active medium, the waveguide being defined by a ridge of the active medium.

12. The method of claim 10, wherein the active component is one or more components selected from a group consisting of an optical modulator and a light sensor.

13. The method of claim 7, wherein forming the second feature on the device precursor includes forming a mask on the device, the mask being included in the portion of the device precursor located above a top of the stop layer.

14. The method of claim 1, wherein the planarization consumes a portion of the stop layer and the stop layer is present on the device precursor after termination of the planarization.

15. The method of claim 14, further comprising:
    removing the stop layer after planarizing the device precursor.

16. The method of claim 1, wherein the recess is between the base and the stop layer such that an imaginary line can be drawn perpendicular to the base while also extending through both the recess and the stop layer.

17. The method of claim 1, wherein the recess is between the base and the stop layer such that an imaginary line perpendicular to the base can extend through a side of the recess and into direct physical contact with the stop layer.

18. The method of claim 1, wherein the stop layer is positioned in an interior of the recess.

19. The method of claim 1, wherein the stop layer is positioned over the recess in a direction perpendicular from the base.

* * * * *